US012323155B2

(12) United States Patent
Liu et al.

(10) Patent No.: US 12,323,155 B2
(45) Date of Patent: Jun. 3, 2025

(54) PHASE ROTATION CONTROLLER AND PHASE ROTATION CONTROL METHOD (71) Applicant: REALTEK SEMICONDUCTOR CORPORATION, Hsinchu (TW)

(72) Inventors: Yao-Chia Liu, Hsinchu (TW); Tung-Hsien Tsai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 15 days.

(21) Appl. No.: 18/583,915

(22) Filed: Feb. 22, 2024

(65) Prior Publication Data
US 2024/0305306 A1 Sep. 12, 2024

(30) Foreign Application Priority Data

Mar. 6, 2023 (TW) .............................. 112108160

(51) Int. Cl.
*H03L 7/099* (2006.01)
*H03K 3/0233* (2006.01)
*H03L 7/081* (2006.01)

(52) U.S. Cl.
CPC ......... *H03L 7/0998* (2013.01); *H03K 3/0233* (2013.01); *H03L 7/0814* (2013.01)

(58) Field of Classification Search
CPC .......... H03K 3/0233; H03K 2005/0052; H03L 7/0998; H03L 7/0814
See application file for complete search history.

(56) References Cited

U.S. PATENT DOCUMENTS

| 8,415,996 B1 * | 4/2013 | Wong ...................... H04L 7/002 327/237 |
| 8,947,147 B1 * | 2/2015 | Zhang ..................... H04L 27/18 327/256 |
| 9,160,521 B2 * | 10/2015 | Tsunoda ................ H03L 7/0814 |
| 10,892,794 B1 * | 1/2021 | Chen .................... H04B 1/7097 |
| 11,722,127 B2 | 8/2023 | Lee et al. |
| 2023/0136927 A1 | 5/2023 | Liu et al. |

* cited by examiner

*Primary Examiner* — Dac V Ha
(74) *Attorney, Agent, or Firm* — WPAT, PC (57) ABSTRACT

A phase rotation control method includes: detecting whether a phase of an output clock signal of a phase interpolator is going to be switched from a current quadrant to a next quadrant according to a trigger signal to generate a state signal; determining a phase adjustment direction of the output clock signal according to an original phase control signal and the state signal to generate a update signal and first control signals; generating the trigger signal and a selection signal according to the update signal and generating second control signals according to the state signal and the first control signals; and when the phase of the output clock signal is switched to the next quadrant, outputting the second control signal as a phase control signal according to the selection signal, in which the phase interpolator adjusts the phase of the output clock signal according to the phase control signal.

20 Claims, 6 Drawing Sheets

PHASE ROTATION CONTROLLER AND PHASE ROTATION CONTROL METHOD

BACKGROUND OF THE INVENTION

1. Field of the Invention

The present disclosure relates to a clock output device, especially to a phase rotation controller for controlling a quadrant switching phase interpolator and a phase rotation control method thereof.

2. Description of Related Art

A phase interpolator may be used to adjust a phase of a clock signal to generate an appropriate clock signal. In some related approaches, the phase interpolator may further set a quadrant corresponding to the phase of the clock signal. In those related approaches, when the quadrant corresponding to the phase of the clock signal is switched, the number of circuits that need to be switched simultaneously within the phase interpolator is too large, resulting in spikes generated inside the circuit, which reduces the accuracy of the clock signal.

SUMMARY OF THE INVENTION

In some aspects of the present disclosure, an object of the present disclosure is, but not limited to, provide a phase rotation controller and a phase rotation control method that are able to reduce spikes, so as to make an improvement to the prior art.

In some aspects of the present disclosure, a phase rotation controller includes a quadrant detection circuit, a quadrant control logic circuit, a trigger circuit, and a multiplexer circuit. The quadrant detection circuit is configured to detect whether a phase of an output clock signal generated by a phase interpolator is going to be switched from a current quadrant to a next quadrant according to a trigger signal to generate a state signal. The quadrant control logic circuit is configured to determine a phase adjustment direction of the output clock signal according to an original phase control signal and the state signal, to generate an update signal and a plurality of first control signals, in which a plurality of bits in the original phase control signal are sequentially shifted with changes of the phase of the output clock signal. The trigger circuit is configured to generate the trigger signal and a selection signal according to the update signal, and generate a second control signal according to the state signal and the plurality of first control signals, in which the plurality of first control signals are configured to indicate the phase adjustment direction of the output clock signal. The multiplexer circuit is configured to select the second control signal from the original phase control signal and the second control signal according to the selection signal and output the second control signal as a phase control signal when the phase of the output clock signal is going to be switched from the current quadrant to the next quadrant, in which the phase interpolator adjusts the phase of the output clock signal according to the phase control signal.

In some aspects of the present disclosure, a phase rotation control method includes the following operations: detecting whether a phase of an output clock signal generated by a phase interpolator is going to be switched from a current quadrant to a next quadrant according to a trigger signal to generate a state signal; determining a phase adjustment direction of the output clock signal according to an original phase control signal and the state signal to generate an update signal and a plurality of first control signals, wherein a plurality of bits in the original phase control signal are sequentially shifted with changes of the phase of the output clock signal; generating the trigger signal and a selection signal according to the update signal, and generating a second control signal according to the state signal and the plurality of first control signals, wherein the plurality of first control signals are configured to indicate the phase adjustment direction of the output clock signal; and selecting the second control signal from the original phase control signal and the second control signal according to the selection signal and outputting the second control signal as a phase control signal when the phase of the output clock signal is going to be switched from the current quadrant to the next quadrant, in which the phase interpolator adjusts the phase of the output clock signal according to the phase control signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
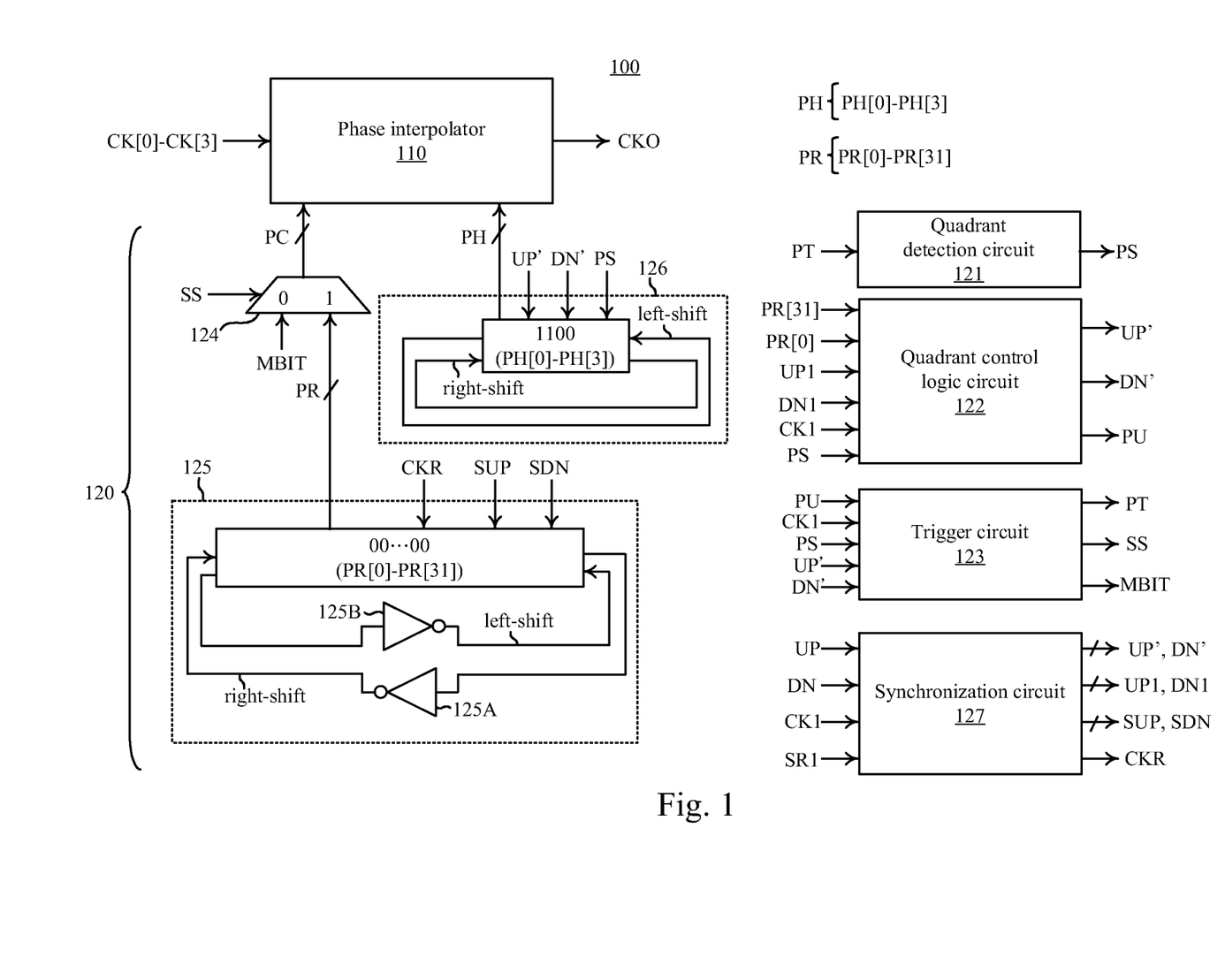
FIG. 1 illustrates a schematic diagram of a clock generator according to some embodiments of the present disclosure.

FIG. 1 illustrates a schematic diagram of a clock generator 100 according to some embodiments of the present disclosure. The clock generator 100 includes a phase interpolator 110 and a phase rotation controller 120. The phase interpolator 110 may be a quadrant-switching phase interpolator, which may adjust a quadrant corresponding to a phase of an output clock signal CKO according to a quadrant control signal PH, and determine the phase of the output clock signal CKO according to a phase control signal PC. The phase rotation controller 120 may generate the phase control signal PC and the quadrant control signal PH to control the phase interpolator 110.

In some embodiments, the phase interpolator 110 may include a first multiplexer circuit and a second multiplexer circuit (not shown) and phase interpolator circuits (not shown). The first multiplexer circuit may receive clock signals CK[0] and CK[2] and output a corresponding one of the clock signals CK[0] and CK[2] as a first clock signal according to bits PH[0] and PH[2] in the quadrant control signal PH. The second multiplexer circuit may receive clock signals CK[1] and CK[3] and output a corresponding one of the clock signals CK[1] and CK[3] as a second clock signal according to bits PH[1] and PH[3] in the quadrant control signal PH. The phase interpolator circuits adjust a weight of each of the first and second clock signals according to the phase control signal PC, and utilize the first and the second clock signals according to these weights to generate the output clock signal CKO. In some embodiments, the aforementioned phase interpolator circuits may be inverter-based phase interpolator circuits, but the present disclosure is not limited thereto.

In some embodiments, the phases of the clock signals CK[0] to CK[3] are sequentially different by 90 degrees. For example, the phase of the clock signal CK[0] is approximately 0 degrees, the phase of the clock signal CK[1] is approximately 90 degrees, the phase of the clock signal CK[2] is approximately 180 degrees, and the phase of the clock signal CK[3] is approximately 270 degrees. With the above arrangement, the first and second multiplexer circuits are able to determine the quadrant corresponding to the phase of the output clock signal CKO according to the quadrant control signal PH. For example, when the first multiplexer circuit outputs the clock signal CK[0] as the first clock signal and the second multiplexer circuit outputs the clock signal CK[1] as the second clock signal, the phase of the output clock signal CKO will be between 0 and 90 degrees (i.e., the first quadrant). When the first multiplexer circuit outputs the clock signal CK[2] as the first clock signal and the second multiplexer circuit outputs the clock signal CK[1] as the second clock signal, the phase of the output clock signal CKO will be between 90 and 180 degrees (i.e., the second quadrant). When the first multiplexer circuit outputs the clock signal CK[2] as the first clock signal and the second multiplexer circuit outputs the clock signal CK[3] as the second clock signal, the phase of the output clock signal CKO will be between 180 and 270 degrees (i.e., the third quadrant). When the first multiplexer circuit outputs the clock signal CK[0] as the first clock signal and the second multiplexer circuit outputs the clock signal CK[3] as the second clock signal, the phase of the output clock signal CKO will be between 270 and 360 degrees (i.e., the fourth quadrant).

The phase rotation controller 120 includes a quadrant detection circuit 121, a quadrant control logic circuit 122, a trigger circuit 123, a multiplexer circuit 124, a shift register circuit 125, and a shift register circuit 126. The quadrant detection circuit 121 may detect whether the phase of the output clock signal CKO is going to be switched from the current quadrant to the next quadrant (for example, but not limited to, from the first quadrant to the second (or fourth) quadrant, etc.) according to a trigger signal PT, and generate a state signal PS. In some embodiments, as the first to fourth quadrants are consecutive quadrants, when the current phase of the output clock signal CKO corresponds to the first or third quadrant, the state signal PS may be set to be a logic value of 0. Alternatively, when the current phase of the output clock signal CKO corresponds to the second or fourth quadrant, the state signal PS may be set to a logic value of 1. In this way, if the phase of the output clock signal CKO is going to be switched from the current quadrant to the next quadrant, the logic value of the state signal PS will be switched from one of the logic values 0 and 1 to the other. By the above setting, it is able to determine whether the phase of the output clock signal CKO is going to be switched from the current quadrant to the next quadrant according to the state signal PS.

Figure 2:
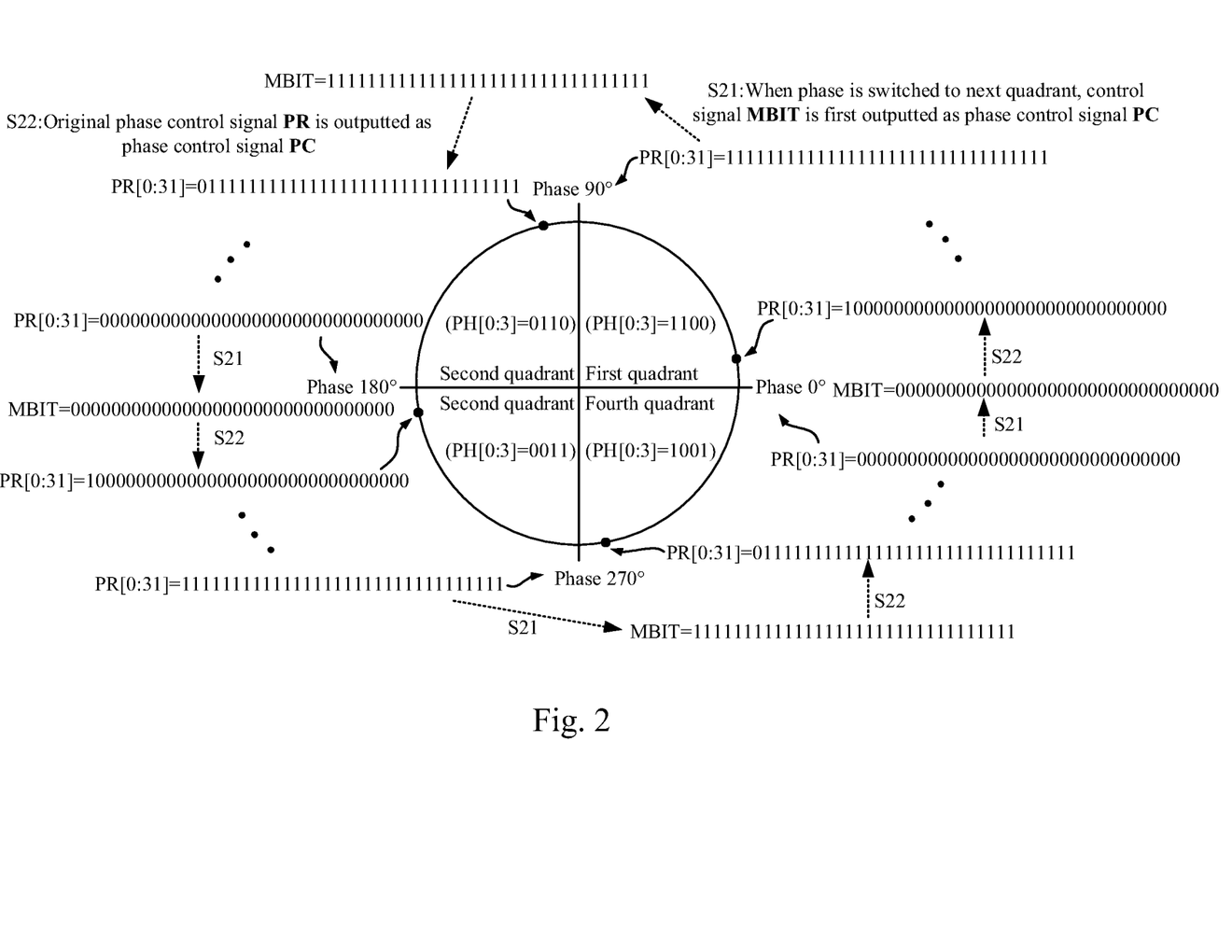
FIG. 2 illustrates a schematic diagram of the relationship among the phase of the output clock signal, the original phase control signal, and the quadrant control signal according to some embodiments of the present disclosure.

The quadrant control logic circuit 122 may determine a phase adjustment direction of the output clock signal CKO according to an original phase control signal PR and the state signal PS to generate an update signal PU, a control signal UP', and a control signal DN', in which bits PR[0] to PR[31] in the original phase control signal PR are shifted in sequence with the phase change of the output clock signal CKO (as shown in FIG. 2). In greater detail, the quadrant control logic circuit 122 may generate the control signal UP' according to at least one first specific bit in the bits PR[0] to PR[31] of the original phase control signal PR (which may be, for example but not limited to, the last bit PR[31]) and a phase adjustment signal UP1, may generate the control signal DN' according to at least one second specific bit in the bits PR[0] to PR[31] of the original phase control signal PR (which may be, for example but not limited to, the first bit PR[0]) and a phase adjustment signal DN1, and may generate the update signal PU according to the control signals UP' and DN'. The phase adjustment signal UP1 is utilized to increase the phase of the output clock signal CKO, and the phase adjustment signal DN1 is utilized to decrease the phase of the output clock signal CKO.

The trigger circuit 123 may generate a trigger signal PT and a selection signal SS according to the update signal PU, and generate a control signal MBIT according to the state signal PS, the control signal UP', and the control signal DN'. In some embodiments, the control signals UP' and DN' may indicate the phase adjustment direction of the output clock signal CKO. For example, when the control signal UP' has a first logic value (such as a logic value of 1) and the control signal DN' has a second logic value (such as a logic value of 0), it indicates that the phase of the output clock signal CKO will increase, and thus the phase adjustment direction is counterclockwise (as shown in FIG. 2). Alternatively, when the control signal DN' has the first logic value and the control signal UP' has the second logic value, it indicates that the phase of the output clock signal CKO will decrease, and thus the phase adjustment direction is clockwise (as shown in FIG. 2).

The multiplexer circuit 124 may output one of the control signal MBIT and the original phase control signal PR as the phase control signal PC according to the selection signal SS, so that the phase interpolator 110 may adjust the phase of the output clock signal CKO according to the phase control signal PC. When the phase rotation controller 120 detects that the phase of the output clock signal CKO is going to be switched from the current quadrant to the next quadrant, the multiplexer circuit 124 outputs the control signal MBIT as the phase control signal PC according to the selection signal SS. Alternatively, when the phase rotation controller 120 detects that the phase of the output clock signal CKO is not going to be switched to the next quadrant, the multiplexer circuit 124 outputs the original phase control signal PR as the phase control signal PC according to the selection signal SS.

With the above configuration, when the phase of the output clock signal CKO is going to be switched from the current quadrant to the next quadrant, the phase rotation controller 120 may first switch the first multiplexer circuit and the second multiplexer circuit (not shown) in the phase interpolator 110. After the switching of the first and second multiplexer circuits is completed, the phase rotation controller 120 then outputs the original phase control signal PR as the phase control signal PC, to allow the phase interpolating circuits in the phase interpolator 110 to switch. In this way, such non-simultaneous switching may reduce unexpected spikes caused by the phase interpolator 110 during the quadrant switching process, to avoid errors in the phase of the output clock signal CKO. Related configurations will be given later with reference to the following figures.

The shift register circuit 125 may perform a bit-shift operation on bits PR[0]-PR[31] of the original phase control signal PR according to phase adjustment signals SUP and SDN and a clock signal CKR, in which the phase adjustment signals SUP and SDN may be generated based on the aforementioned phase adjustment signals UP1 and DN1, respectively. In some embodiments, all bits PR[0]-PR[31] are preset to have the logic values of 0, and the bits PH[0]~PH[3] are preset to 1100, such that a default phase of the output clock signal CKO is 0 degrees and is located in the first quadrant (as shown in FIG. 2). When both the phase adjustment signal SUP and the state signal PS have the logic values of 1, it indicates that the quadrant corresponding to the phase of the output clock signal CKO is going to be switched to the second quadrant, and the phase adjustment direction is counterclockwise shown in FIG. 2 (i.e., phase increase). Under this condition, the shift register circuit 125 is triggered by a clock signal CKR and sequentially shifts logic values of 1 from the first bit PR[0] to the last bit PR[31] through an internal inverter circuit 125A to gradually adjust the original phase control signal PR. Alternatively, when the phase adjustment signal SDN has the logic value of 1 and the state signal PS has the logic value of 0, it indicates that the quadrant corresponding to the phase of the output clock signal CKO remains in the first quadrant, and its phase adjustment direction is clockwise shown in FIG. 2 (i.e., phase decrease). Under this condition, the shift register circuit 125 is triggered by the clock signal CKR and sequentially shifts the logic values of 1 from the last bit PR[31] to the first bit PR[0] through an internal inverter circuit 125B to gradually adjust the original phase control signal PR.

The shift register circuit 126 may perform a bit-shift operation on the quadrant control signal PH according to the state signal PS, the control signal UP', and the control signal DN', such that the phase interpolator 110 is able to determine the corresponding quadrant of the phase of the output clock signal CKO according to the quadrant control signal PH. For example, the default values of the bits PH[0]-PH[3] in the quadrant control signal PH are sequentially set to 1100. If the control signal UP' has the logic value of 1, it indicates that the phase of the output clock signal CKO is going to increase and switch to the next quadrant. Under this condition, when the trigger signal PT has the logic value of 1 to update the state signal PS, the shift register circuit 126 may be triggered by the updated state signal PS to right-shift the bits PH[0]-PH[3]. Alternatively, if the control signal DN' has the logic value of 1, it indicates that the phase of the output clock signal CKO is going to decrease and switch to the next quadrant. Under this condition, when the trigger signal PT has the logic value of 1 to update the state signal PS, the shift register circuit 126 may be triggered by the updated state signal PS to left-shift the multiple bits PH[0]-PH[3].

In some embodiments, the phase rotation controller 120 may further include a synchronization circuit 127, which is configured to synchronize other control signals and/or clock signals. For example, the synchronization circuit 127 may generate the control signals UP' and DN' and the clock signal CKR according to the original phase adjustment signals UP and DN, a clock signal CK1, and a reset signal SR1. Configurations about the synchronization circuit 127 will be given with reference to FIG. 6.

FIG. 2 illustrates a schematic diagram of the relationship among the phase of the output clock signal CKO, the original phase control signal PR, and the quadrant control signal PH according to some embodiments of the present disclosure. As shown in FIG. 2, the phase of the output clock signal CKO may be divided into the first to fourth quadrants. When the bits PH[0]-PH[3] (indicated as PH[0:3]) in the quadrant control signal PH are 1100 (i.e., bits PH[0] and PH[1] are the logic values of 1, and bits PH[2] and PH[3] are the logic value of 0), the phase of the output clock signal CKO is 0 to 90 degrees (corresponding to the first quadrant). As previously mentioned, when the phase of the output clock signal CKO is not switched from the current quadrant to the next quadrant, the multiplexer circuit 124 outputs the original phase control signal PR as the phase control signal PC according to the selection signal SS. Under this condition, when all bits PR[0]-PR[31] (indicated as PR[0:31]) in the original phase control signal PR are logic values of 0, the phase of the output clock signal CKO is 0 degrees. When all bits PR[0]-PR[31] are logic values of 1, the phase of the output clock signal CKO is 90 degrees. When the bits PH[0]-PH[3] are 1100, the phase rotation controller 120 may sequentially shift logic values of 1 from the first bit PR[0] to the last bit PR[31] to increase the phase of the output clock signal CKO from 0 degrees to 90 degrees. Alternatively, the phase rotation controller 120 may sequentially shift logic values of 0 from the last bit PR[31] to the first bit PR[0] to decrease the phase of the output clock signal CKO from 90 degrees to 0 degrees.

Similarly, when the bits PH[0]-PH[3] are 0110, the phase of the output clock signal CKO is 90 to 180 degrees (corresponding to the second quadrant). Under this condition, when all bits PR[0]-PR[31] are logic values of 1, the phase of the output clock signal CKO is 90 degrees. When all bits PR[0]-PR[31] are logic values of 0, the phase of the output clock signal CKO is 180 degrees. When the bits PH[0]-PH[3] are 0011, the phase of the output clock signal CKO is 180 to 270 degrees (corresponding to the third quadrant). Under this condition, when all bits PR[0]-PR[31] are logic values of 0, the phase of the output clock signal CKO is 180 degrees. When all bits PR[0]-PR[31] are logic values of 1, the phase of the output clock signal CKO is 270 degrees. When the bits PH[0]-PH[3] are 1001, the phase of the output clock signal CKO is 270 to 360 degrees (corresponding to the fourth quadrant). Under this condition, when all bits PR[0]-PR[31] are logic values of 1, the phase of the output clock signal CKO is 270 degrees, and when all bits PR[0]-PR[31] are logic values of 0, the phase of the output clock signal CKO is 360 degrees (i.e., 0 degrees).

On the other hand, as previously mentioned, when the quadrant detection circuit 121 detects that the phase of the output clock signal CKO is going to be switched from the current quadrant to the next quadrant, the multiplexer circuit 124 outputs the control signal MBIT as the phase control signal PC according to the selection signal SS (i.e., the operation S21 as labeled in the figure). For example, before the phase of the output clock signal CKO is going to be switched from the first quadrant to the second quadrant, the multiplexer circuit 124 outputs the original phase control signal PR as the phase control signal PC. Under this condition, the phase of the output clock signal CKO is 90 degrees (i.e., the highest phase of the first quadrant), and the bits of the phase control signal PC will be identical to the bits PR[0]-PR[31] (which are logic values of 1). When the phase of the output clock signal CKO is going to be switched from the first quadrant to the second quadrant, the multiplexer circuit 124 outputs the control signal MBIT as the phase control signal PC according to the selection signal SS, in which the control signal MBIT is identical to the original phase control signal PR in the previous cycle (which corresponds to the highest phase of the first quadrant), which makes the phase control signal PC temporarily remain unchanged.

For example, all bits in the control signal MBIT are logic values of 1 (which are identical to the logic values of the bits PR[0]-PR[31] in the previous cycle, and correspond to the highest phase of 90 degrees in the first quadrant). In other words, under this condition, the control signal MBIT is identical to the original phase control signal PR in the previous cycle, which makes the phase control signal PC remain unchanged. Thus, the first multiplexer circuit and the second multiplexer circuit in the phase interpolator 110 may first switch according to the quadrant control signal PH, and the phase interpolator circuits in the phase interpolator 110 receive the phase control signal PC with the same logic values and will not switch. Afterwards, the multiplexer circuit 124 outputs the original phase control signal PR as the phase control signal PC according to the selection signal SS (i.e., operation S22 in the figure). Under this condition, the bits of the phase control signal PC will be identical to the bits PR[0]-PR[31] (which are 0111 . . . 111). In this way, after the switching of the first and second multiplexer circuits is completed, phase interpolator circuits in the phase interpolator 110 may begin to switch according to the phase control signal PC and adjust the phase of the output clock signal CKO. In other words, when it is detected that the phase of the output clock signal CKO is going to be switched to the next quadrant, the multiplexer circuit 124 outputs the control signal MBIT (which is identical to the original phase control signal PR in the previous cycle) as the phase control signal PC, which makes the phase interpolator circuits in the phase interpolator 110 stop switching. After the first and second multiplexer circuits in the phase interpolator 110 complete the switching, the multiplexer circuit 124 outputs the original phase control signal PR as the phase control signal PC, which makes the phase interpolator circuits in the phase interpolator 110 begin to switch. In this manner, circuits in the phase interpolator 110 may perform the switching separately (rather than simultaneously) when the phase of the output clock signal CKO is to be switched to the next quadrant, thereby reducing the unexpected spikes.

By this analogy, when it is detected that the phase of the output clock signal CKO is going to be switched from the second quadrant to the third quadrant, the multiplexer circuit 124 outputs the control signal MBIT as the phase control signal PC according to the selection signal SS. Under this condition, the bits in the control signal MBIT will be identical to the logic values of the bits PR[0]-PR[31] in the original phase control signal PR in the previous cycle (for example, logic values of 0 which correspond to the highest phase of 180 degrees in the second quadrant), which makes the phase control signal PC remain unchanged. Next, the multiplexer circuit 124 outputs the original phase control signal PR as the phase control signal PC according to the selection signal SS. Under this condition, the bits of the phase control signal PC will be identical to the bits PR[0]-PR[31] (which are 1000 . . . 000). When it is detected that the phase of the output clock signal CKO is going to be switched from the third quadrant to the fourth quadrant, the multiplexer circuit 124 outputs the control signal MBIT as the phase control signal PC according to the selection signal SS. Under this condition, the bits in the control signal MBIT will be identical to the logic values of the bits PR[0]-PR[31] in the original phase control signal PR in the previous cycle (for example, logic values of 1 which correspond to the highest phase of 270 degrees in the third quadrant), which makes the phase control signal PC remain unchanged. Next, the multiplexer circuit 124 outputs the original phase control signal PR as the phase control signal PC according to the selection signal SS. Under this condition, the bits of the phase control signal PC will be identical to the bits PR[0]-PR[31] (which are 0111 . . . 111). Similarly, when it is detected that the phase of the output clock signal CKO is going to be switched from the fourth quadrant to the first quadrant, the multiplexer circuit 124 outputs the control signal MBIT as the phase control signal PC according to the selection signal SS. Under this condition, the bits in the control signal MBIT will be identical to the logic values of the bits PR[0]-PR[31] in the original phase control signal PR in the previous cycle (for example, logic values of 0 which correspond to the highest phase of 360 degrees in the fourth quadrant), which makes the phase control signal PC remain unchanged. Next, the multiplexer circuit 124 outputs the original phase control signal PR as the phase control signal PC according to the selection signal SS. Under this condition, the bits of the phase control signal PC will be identical to the bits PR[0]-PR[31] (which are 1000 . . . 000).

Figure 3:
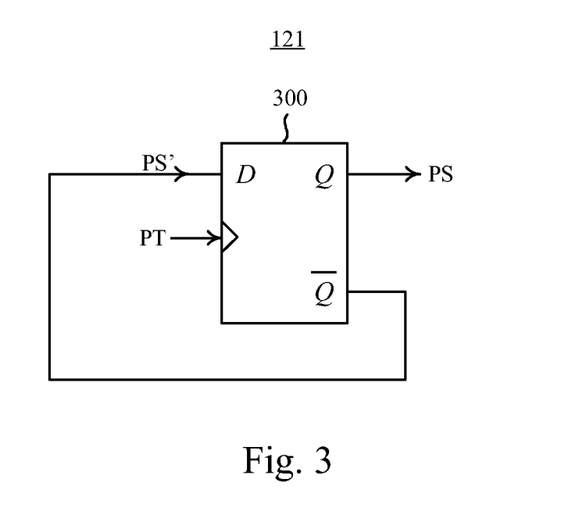
FIG. 3 illustrates a schematic diagram of the quadrant detection circuit in FIG. 1 according to some embodiments of the present disclosure.

FIG. 3 illustrates a schematic diagram of the quadrant detection circuit 121 in FIG. 1 according to some embodiments of the present disclosure. The quadrant detection circuit 121 includes a flip-flop circuit 300. In some embodiments, the flip-flop circuit 300 may operate as a divide-by-2 counter circuit. The flip-flop circuit 300 may output the signal PS' as the state signal PS according to the trigger signal PT, in which the signal PS' is the logical inverse of the state signal PS. For example, the flip-flop circuit 300 may be a D-type flip-flop circuit, which may output the signal PS' from an inverted output end (labeled as $\overline{Q}$) to an input end (labeled as D), and output the state signal PS from a non-inverted output end (marked as Q).

As previously mentioned, when the phase of the output clock signal CKO is in the first or third quadrant, the state signal PS has the logic value of 0, and when the phase of the output clock signal CKO is in the second or fourth quadrant, the state signal PS has the logic value of 1. With the aforementioned configuration, the flip-flop circuit 300 may update the state signal PS according to the trigger signal PT. When the state signal PS is switched, it indicates that the phase of the output clock signal CKO will be switched from the current quadrant to the next quadrant.

Figure 4:
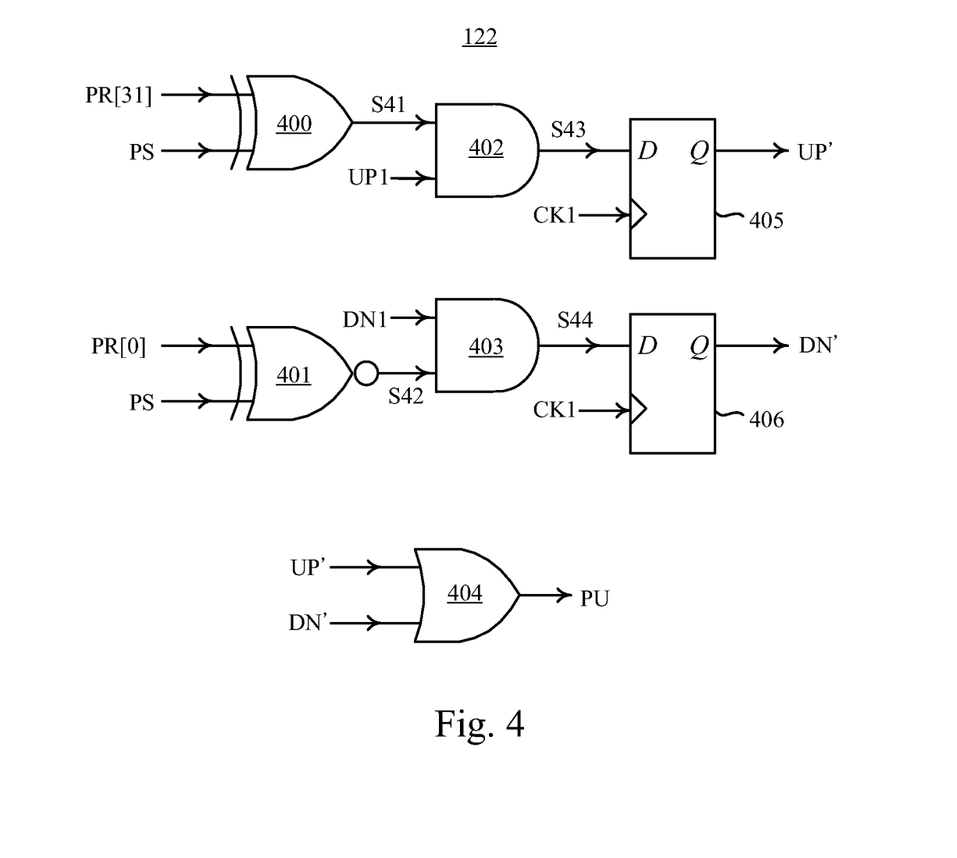
FIG. 4 illustrates a schematic diagram of the quadrant control logic circuit in FIG. 1 according to some embodiments of the present disclosure.

FIG. 4 illustrates a schematic diagram of the quadrant control logic circuit 122 in FIG. 1 according to some embodiments of the present disclosure. The quadrant control logic circuit 122 includes logic gate circuits 400-404 and flip-flop circuits 405 and 406. The logic gate circuit 400 is configured to generate a signal S41 according to the last bit PR[31] (i.e., the aforementioned at least one first specific bit) and the state signal PS from the original phase control signal PR. In some embodiments, the logic gate circuit 400 may be an exclusive OR (XOR) gate circuit. The logic gate circuit 401 is configured to generate a signal S42 according to the first bit PR[0] (i.e., the aforementioned at least one second specific bit) and the state signal PS from the original phase control signal PR. In some embodiments, the logic gate circuit 401 may be an exclusive NOR (XNOR) gate circuit.

As shown in FIG. 2, when the phase of the output clock signal CKO is going to be switched from the first quadrant to the second quadrant, the last bit PR[31] remains at the logic value of 1 and the first bit PR[0] is switched from the logic value of 1 to the logic value of 0. As previously stated, when the phase of the output clock signal CKO is going to be switched from the first quadrant to the second quadrant, the state signal PS will be switched from the logic value of 0 to the logic value of 1. Under this condition, the logic gate circuit 400 may generate a signal S41 having the logic value of 0, and the logic gate circuit 401 may generate a signal S42 having the logic value of 0. Alternatively, when the phase of the output clock signal CKO is not going to be switched from the first quadrant to the second quadrant, the state signal PS may continue to have the logic value of 0, and the last bit PR[31] and the first bit PR[0] may continue to have the logic values of 1. Under this condition, the logic gate circuit 400 may generate the signal S41 with the logic value of 1, and the logic gate circuit 401 may generate the signal S42 having the logic value of 0. Accordingly, it should be understood that the signals S41 and S42 may be utilized to indicate whether the phase of the output clock signal CKO is going to be switched from the current quadrant to the next quadrant.

The logic gate circuit 402 may generate a signal S43 according to the phase adjustment signal UP1 and the signal S41. The logic gate circuit 403 may generate a signal S44 according to the phase adjustment signal DN1 and the signal S42. In some embodiments, each of logic gate circuits 402 and 403 may be an AND gate circuit. The flip-flop circuit 405 and the flip-flop circuit 406 output signals S43 and S44 as the control signals UP' and DN', respectively, according to the clock signal CK1. In greater detail, the flip-flop circuit 405 outputs the signal S43 as the control signal UP' according to the clock signal CK1, and the flip-flop circuit 406 outputs the signal S44 as the control signal DN' according to the clock signal CK1. In some embodiments, each of the flip-flop circuits 405 and 406 may be a D-type flip-flop circuit. The logic gate circuit 404 may generate the update signal PU according to the control signals UP' and DN'. In some embodiments, the logic gate circuit 404 may be an OR gate. The types of logic gates shown in FIG. 4 are given for illustrative purposes, and the present disclosure is not limited thereto. Various logic gates that may implement the same relevant operations are within the contemplated scope of the present disclosure.

Figure 5A:
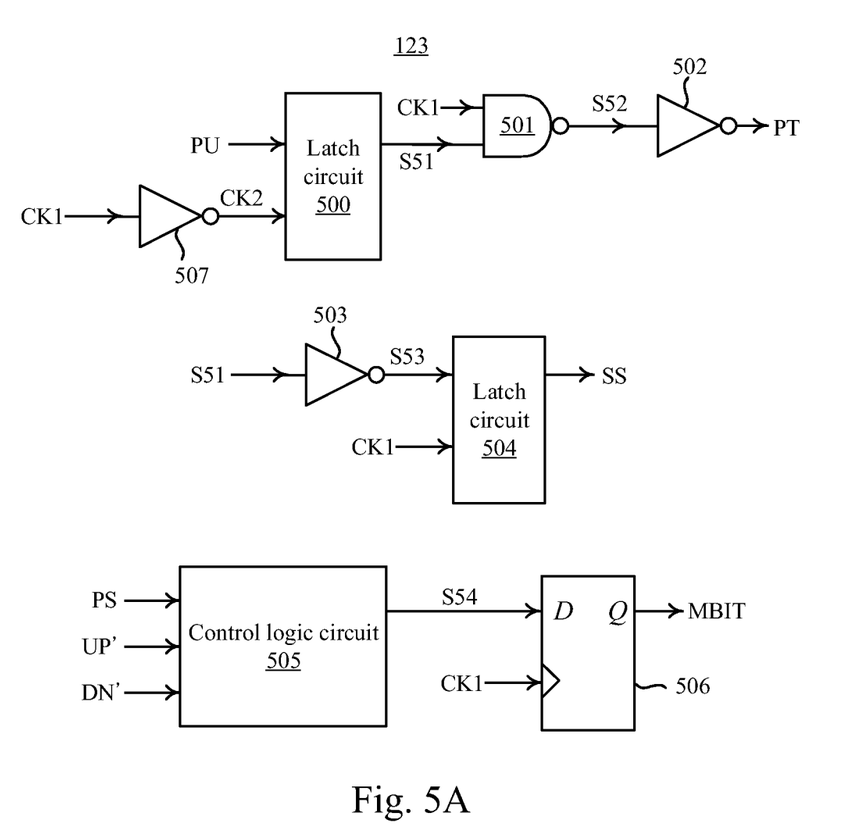
FIG. 5A illustrates a schematic diagram of the trigger circuit in FIG. 1 according to some embodiments of the present disclosure.

FIG. 5A illustrates a schematic diagram of the trigger circuit 123 in FIG. 1 according to some embodiments of the present disclosure. The trigger circuit 123 includes a latch circuit 500, logic gate circuits 501-503, a latch circuit 504, a control logic circuit 505, and a flip-flop circuit 506. The latch circuit 500 may output the update signal PU as a signal S51 according to a clock signal CK2. The logic gate circuit 501 may generate a signal S52 according to the clock signal CK1 and the signal S51, in which the clock signal CK1 is the logical inverse of the clock signal CK2. For example, the trigger circuit 123 may further include an inverter circuit 507, which may generate the clock signal CK2 according to the clock signal CK1. In some embodiments, the logic gate circuit 501 may be a NAND gate circuit. The logic gate circuit 502 generates the trigger signal PT according to the signal S52. The logic gate circuit 503 generates a signal S53 according to the signal S51. In some embodiments, each of the logic gate circuits 502 and 503 may be an inverter circuit. The latch circuit 504 may output the signal S53 as the selection signal SS according to the clock signal CK1. In some embodiments, each of the latch circuits 500 and 504 may be a D-type latch circuit. The control logic circuit 505 may generate a signal S54 according to the state signal PS, the control signal UP', and the control signal DN'. The flip-flop circuit 506 may output the signal S54 as the control signal MBIT according to the clock signal CK1. In some embodiments, the flip-flop circuit 506 may be a D-type flip-flop circuit.

Figure 5B:
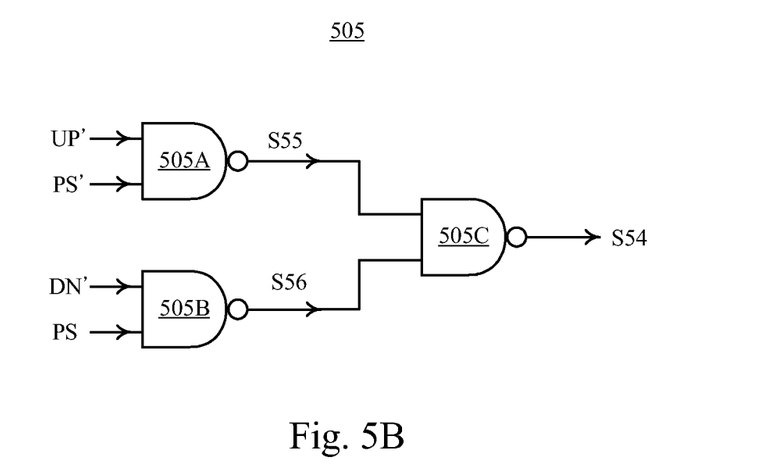
FIG. 5B illustrates a schematic diagram of the control logic circuit in FIG. 5A according to some embodiments of the present disclosure.

FIG. 5B illustrates a schematic diagram of the control logic circuit 505 in FIG. 5A according to some embodiments of the present disclosure. The control logic circuit 505 may include logic gate circuits 505A, 505B, and 505C. The logic gate circuit 505A may generate a signal S55 according to control signal UP' and signal PS', in which the signal PS' is the logical inverse of the state signal PS. The logic gate circuit 505B may generate a signal S56 according to the control signal DN' and the state signal PS. The logic gate circuit 505C may generate the signal S54 according to the signal S55 and the signal S56. In some embodiments, each of the logic gate circuits 505A, 505B, and 505C may be a NAND gate circuit.

In some embodiments, the control signal MBIT may be a logical signal with multiple bits (for example, 32 bits). Based on different quadrant switching and phase adjustment directions, all bits in the control signal MBIT may be correspondingly set to logic values of 1 or logic values of 0 (as shown in FIG. 2) to stop the switching of the phase interpolator circuits in the phase interpolator 110.

Figure 6:
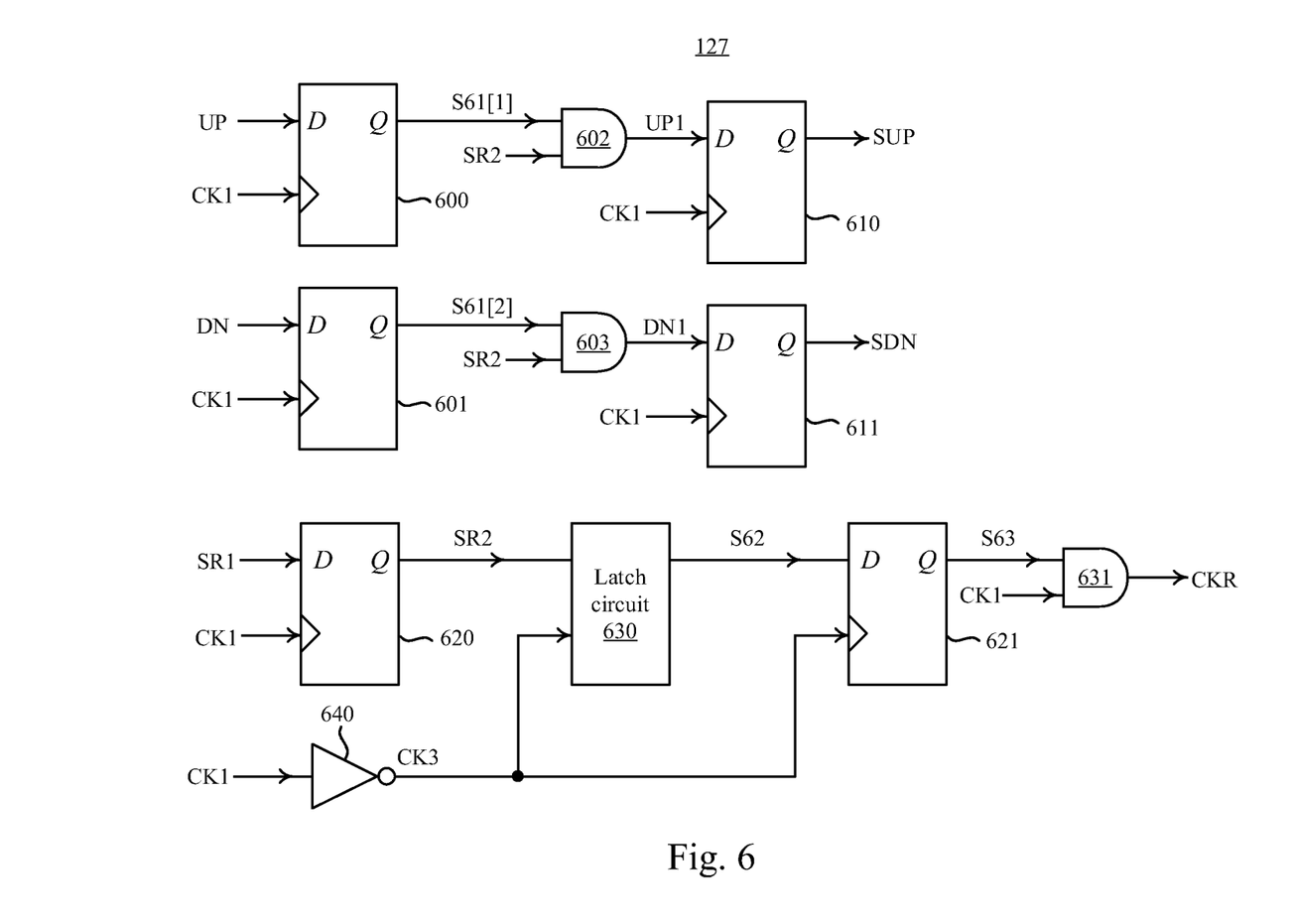
FIG. 6 illustrates a schematic diagram of the synchronization circuit in FIG. 1 according to some embodiments of the present disclosure.

FIG. 6 illustrates a schematic diagram of the synchronization circuit 127 in FIG. 1 according to some embodiments of the present disclosure. The synchronization circuit 127 includes flip-flop circuits 600, 601, 610, 611, 620, and 621, logic gate circuits 602 and 603, a latch circuit 630, and a logic gate circuit 631. The flip-flop circuits 600 and 601 output the original phase adjustment signals UP and DN as signals S61[1] and S61[2] respectively, according to the clock signal CK1. The logic gate circuits 602 and 603 generate the phase adjustment signals UP1 and DN1, respectively, according to the signals S61[1] and S61[2] and the reset signal SR1. The flip-flop circuits 610 and 611 output the phase adjustment signals UP1 and DN1 as the phase adjustment signals SUP and SDN, respectively, according to the clock signal CK1.

In greater detail, the flip-flop circuit 600 outputs the original phase adjustment signal UP as the signal S61[1] according to the clock signal CK1. The logic gate circuit 602 generates the phase adjustment signal UP1 according to the signal S61[1] and a reset signal SR2. The flip-flop circuit 610 outputs the phase adjustment signal UP1 as the phase adjustment signal SUP according to the clock signal CK1. The reset signal SR2 is generated based on the reset signal SR1 and the clock signal CK1. Similarly, the flip-flop circuit 601 outputs the original phase adjustment signal DN as the signal S61[2] according to the clock signal CK1. The logic gate circuit 603 generates the phase adjustment signal DN1 according to the signal S61[2] and the reset signal SR2. The flip-flop circuit 611 outputs the phase adjustment signal DN1 as phase adjustment signal SDN according to clock signal CK1.

The flip-flop circuit 620 outputs the reset signal SR1 as the reset signal SR2 according to the clock signal CK1. The latch circuit 630 outputs the reset signal SR2 as the signal S62 according to a clock signal CK3, in which the clock signal CK3 is the logical inverse of the clock signal CK1. For example, the synchronization circuit 127 may further include an inverter circuit 640, which generates the clock signal CK3 according to the clock signal CK1. The flip-flop circuit 621 outputs the signal S62 as the signal S63 according to the clock signal CK3. The logic gate circuit 631 generates the clock signal CKR according to the signal S63 and the clock signal CK1.

In some embodiments, each of the flip-flop circuits 600, 601, 610, 611, 620, and 621 may be D-type flip-flop circuits. In some embodiments, each of the logic gate circuits 602 and 603 may be an AND gate circuit. In some embodiments, the latch circuit 630 may be a D-type latch circuit. In some embodiments, the logic gate circuit 631 may be an AND gate circuit. The types of logic gate circuits in the aforementioned drawings are given for illustrative purposes, and the present disclosure is not limited thereto. Various logic gate circuits that may implement the same functions are within the contemplated scope of the present disclosure.

Figure 7:
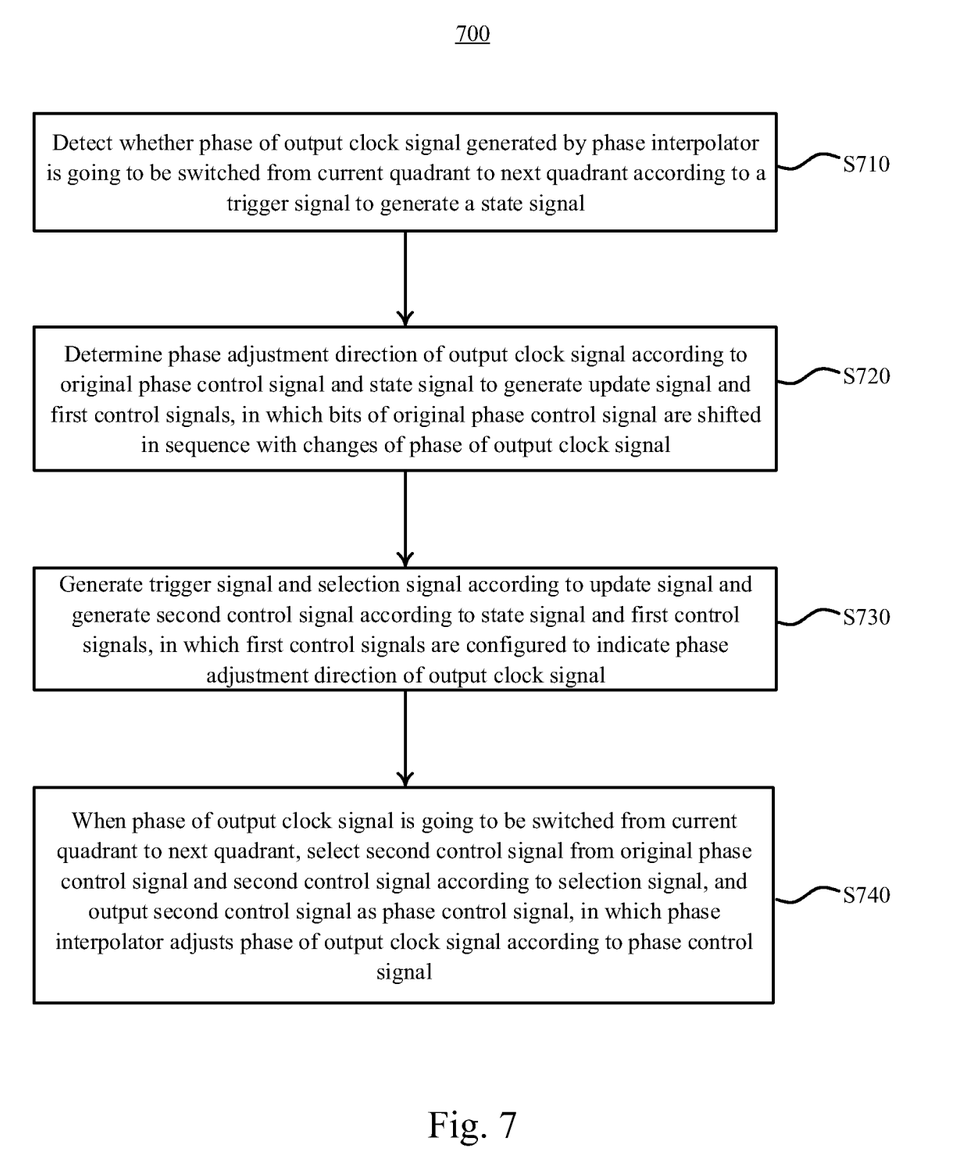
FIG. 7 illustrates a flow chart of a phase rotation control method according to some embodiments of the present disclosure.

FIG. 7 illustrates a flow chart of a phase rotation control method 700 according to some embodiments of the present disclosure. In operation S710, whether a phase of an output clock signal generated by a phase interpolator is going to be switched from a current quadrant to a next quadrant is detected according to a trigger signal to generate a state signal. In operation S720, a phase adjustment direction of the output clock signal is determined according to an original phase control signal and the state signal to generate an update signal and first control signals, in which bits of the original phase control signal are shifted in sequence with changes of the phase of the output clock signal. In operation S730, the trigger signal and a selection signal are generated according to the update signal and a second control signal is generated according to the state signal and the first control signals, in which the first control signals are configured to indicate the phase adjustment direction of the output clock signal. In operation S740, when the phase of the output clock signal is going to be switched from the current quadrant to the next quadrant, the second control signal is selected from the original phase control signal and the second control signal according to the selection signal and outputted as a phase control signal, in which the phase interpolator adjusts the phase of the output clock signal according to the phase control signal.

The above operations of the phase rotation control method 700 can be understood with reference to above embodiments, and thus the repetitious descriptions are not further given. The above description of the phase rotation control method 700 includes exemplary operations, but the operations of the phase rotation control method 700 are not necessarily performed in the order described above. Operations of the phase rotation control method 700 may be added, replaced, changed order, and/or eliminated, or the operations of the phase rotation control method 700 may be executed simultaneously or partially simultaneously as appropriate, in accordance with the spirit and scope of various embodiments of the present disclosure.

As described above, the phase rotation controller and the phase rotation control method provided by some embodiments of the present disclosure are able to temporarily stop the switching of some circuits in the phase interpolator when the quadrant corresponding to the phase of the output clock signal from the phase interpolator is going to be switched, in order to reduce the impact of spikes.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A phase rotation controller, comprising:
a quadrant detection circuit configured to detect whether a phase of an output clock signal generated by a phase interpolator is going to be switched from a current quadrant to a next quadrant according to a trigger signal to generate a state signal;
a quadrant control logic circuit configured to determine a phase adjustment direction of the output clock signal according to an original phase control signal and the state signal, to generate an update signal and a plurality of first control signals, wherein a plurality of bits in the original phase control signal are sequentially shifted with changes of the phase of the output clock signal;
a trigger circuit configured to generate the trigger signal and a selection signal according to the update signal, and generate a second control signal according to the state signal and the plurality of first control signals, wherein the plurality of first control signals are configured to indicate the phase adjustment direction of the output clock signal; and a multiplexer circuit configured to select the second control signal from the original phase control signal and the second control signal according to the selection signal and output the second control signal as a phase control signal when the phase of the output clock signal is going to be switched from the current quadrant to the next quadrant, wherein the phase interpolator adjusts the phase of the output clock signal according to the phase control signal.

2. The phase rotation controller of claim 1, wherein when the phase of the output clock signal is not going to be switched to the next quadrant, the multiplexer circuit is further configured to select the original phase control signal from the original phase control signal and the second control signal according to the selection signal, and output the original phase control signal as the phase control signal.

3. The phase rotation controller of claim 1, wherein the second control signal is identical to the original phase control signal in a previous cycle.

4. The phase rotation controller of claim 1, wherein the quadrant control logic circuit is further configured to generate a first one of the plurality of first control signals according to at least one first specific bit in the plurality of bits and a first phase adjustment signal, and generate a second one of the plurality of first control signals according to at least one second specific bit in the plurality of bits and a second phase adjustment signal, the first phase adjustment signal is configured to increase the phase of the output clock signal, and the second phase adjustment signal is configured to decrease the phase of the output clock signal.

5. The phase rotation controller of claim 4, further comprising:
a first shift register circuit configured to perform a bit-shift operation on the plurality of bits in the original phase control signal according to a plurality of third phase adjustment signals and a first clock signal, wherein each of the plurality of third phase adjustment signals is generated based on a corresponding one of the first phase adjustment signal and the second phase adjustment signal; and
a second shift register circuit configured to perform a bit-shift operation on a quadrant control signal according to the plurality of first control signals and the state signal, wherein the phase interpolator is configured to determine a quadrant corresponding to the phase of the output clock signal according to the quadrant control signal.

6. The phase rotation controller of claim 5, further comprising:
a synchronization circuit configured to generate the plurality of first control signals and the first clock signal according to a plurality of original phase adjustment signals, a second clock signal, and a first reset signal.

7. The phase rotation controller of claim 6, wherein the synchronization circuit comprises:
a plurality of first flip-flop circuits configured to output the plurality of original phase adjustment signals as a plurality of first signals, respectively, according to the second clock signal;
a plurality of first logic gate circuits configured to generate the first phase adjustment signal and the second phase adjustment signal according to the plurality of first signals and a second reset signal, wherein the second reset signal is generated based on the first reset signal and the second clock signal; and a plurality of second flip-flop circuits configured to output the first phase adjustment signal and the second phase adjustment signal as the plurality of third phase adjustment signals, respectively, according to the second clock signal.

8. The phase rotation controller of claim 7, wherein the synchronization circuit comprises:
a third flip-flop circuit configured to output the first reset signal as the second reset signal according to the second clock signal;
a latch circuit configured to output the second reset signal as a first signal according to a third clock signal, wherein the third clock signal is a logical inverse of the second clock signal;
a fourth flip-flop circuit configured to output the first signal as a second signal according to the third clock signal; and
a second logic gate circuit configured to generate the first clock signal according to the second signal and the second clock signal.

9. The phase rotation controller of claim 8, wherein each of the plurality of first logic gate circuits and the second logic gate circuit is an AND gate circuit.

10. The phase rotation controller of claim 1, wherein the quadrant control logic circuit comprises:
a first logic gate circuit configured to generate a first signal according to the state signal and a last bit of the plurality of bits;
a second logic gate circuit configured to generate a second signal according to the state signal and a first bit of the plurality of bits;
a third logic gate circuit configured to generate a third signal according to a first phase adjustment signal and the first signal, wherein the first phase adjustment signal is configured to increase the phase of the output clock signal;
a fourth logic gate circuit configured to generate a fourth signal according to a second phase adjustment signal and the second signal, wherein the second phase adjustment signal is configured to decrease the phase of the output clock signal;
a plurality of flip-flop circuits configured to output the third signal and the fourth signal as the plurality of first control signals, respectively, according to a clock signal; and
a fifth logic gate circuit configured to generate the update signal according to the plurality of first control signals.

11. The phase rotation controller of claim 10, wherein the first logic gate circuit is an XOR gate circuit, the second logic gate circuit is a XNOR gate circuit, each of the third logic gate circuit and the fourth logic gate circuit is an AND gate circuit, and the fifth logic gate circuit is an OR gate circuit.

12. The phase rotation controller of claim 1, wherein the quadrant detection circuit comprises:
a flip-flop circuit configured to output a first signal as the state signal according to the trigger signal, wherein the first signal is a logical inverse of the state signal.

13. The phase rotation controller of claim 1, wherein the trigger circuit comprises:
a first latch circuit configured to output the update signal as a first signal according to a first clock signal;
a first logic gate circuit configured to generate a second signal according to a second clock signal and the first signal, wherein the first clock signal is a logical inverse of the second clock signal;

a second logic gate circuit configured to generate the trigger signal according to the second signal;

a third logic gate circuit configured to generate a third signal according to the first signal;

a second latch circuit configured to output the third signal as the selection signal according to the second clock signal;

a control logic circuit configured to generate a fourth signal according to the state signal and the plurality of first control signals; and a flip-flop circuit configured to output the fourth signal as the second control signal according to the second clock signal.

14. The phase rotation controller of claim 13, wherein the first logic gate circuit is a NAND gate circuit, and each of the second logic gate circuit and the third logic gate circuit is an inverter circuit.

15. The phase rotation controller of claim 13, wherein the control logic circuit comprises:

a fourth logic gate circuit configured to generate a sixth signal according to a first one of the plurality of first control signals and a fifth signal, wherein the fifth signal is a logical inverse of the state signal;

a fifth logic gate circuit configured to generate a seventh signal according to a second one of the plurality of first control signals and the state signal; and a sixth logic gate circuit configured to generate the fourth signal according to the sixth signal and the seventh signal.

16. The phase rotation controller of claim 15, wherein each of the first logic gate circuit, the second logic gate circuit, and the third logic gate circuit is a NAND gate circuit.

17. A phase rotation control method, comprising:

detecting whether a phase of an output clock signal generated by a phase interpolator is going to be switched from a current quadrant to a next quadrant according to a trigger signal to generate a state signal;

determining a phase adjustment direction of the output clock signal according to an original phase control signal and the state signal to generate an update signal and a plurality of first control signals, wherein a plurality of bits in the original phase control signal are sequentially shifted with changes of the phase of the output clock signal;

generating the trigger signal and a selection signal according to the update signal, and generating a second control signal according to the state signal and the plurality of first control signals, wherein the plurality of first control signals are configured to indicate the phase adjustment direction of the output clock signal; and selecting the second control signal from the original phase control signal and the second control signal according to the selection signal and outputting the second control signal as a phase control signal when the phase of the output clock signal is going to be switched from the current quadrant to the next quadrant, wherein the phase interpolator adjusts the phase of the output clock signal according to the phase control signal.

18. The phase rotation control method of claim 17, further comprising:

when the phase of the output clock signal is not going to be switched to the next quadrant, selecting the original phase control signal from the original phase control signal and the second control signal according to the selection signal, and outputting the original phase control signal as the phase control signal.

19. The phase rotation control method of claim 17, further comprising:

generating a first one of the plurality of first control signals according to at least one first specific bit in the plurality of bits and a first phase adjustment signal; and generating a second one of the plurality of first control signals according to at least one second specific bit in the plurality of bits and a second phase adjustment signal, wherein the first phase adjustment signal is configured to increase the phase of the output clock signal, and the second phase adjustment signal is configured to decrease the phase of the output clock signal.

20. The phase rotation control method of claim 17, wherein the second control signal is identical to the original phase control signal in a previous cycle.

* * * * *